United States Patent
Butzmann et al.

(10) Patent No.: US 8,362,765 B2
(45) Date of Patent: Jan. 29, 2013

(54) SENSOR DEVICE AND METHOD

(75) Inventors: Stefan Butzmann, Beilstein (DE); Marcus Prochaska, Pattensen (DE)

(73) Assignee: NXP B.V., Eindhoven (NL)

( * ) Notice: Subject to any disclaimer, the term of this patent is extended or adjusted under 35 U.S.C. 154(b) by 384 days.

(21) Appl. No.: 12/678,514

(22) PCT Filed: Aug. 27, 2008

(86) PCT No.: PCT/IB2008/053443
§ 371 (c)(1),
(2), (4) Date: Mar. 17, 2010

(87) PCT Pub. No.: WO2009/037607
PCT Pub. Date: Mar. 26, 2009

(65) Prior Publication Data
US 2010/0207623 A1  Aug. 19, 2010

(30) Foreign Application Priority Data
Sep. 21, 2007 (EP) .................................. 07116900

(51) Int. Cl.
*G01R 33/02* (2006.01)
(52) U.S. Cl. ...................................... 324/252
(58) Field of Classification Search .................. None
See application file for complete search history.

(56) References Cited

U.S. PATENT DOCUMENTS

| | | |
|---|---|---|
| 4,197,987 A | 4/1980 | Lazzari |
| 4,703,378 A | 10/1987 | Imakoshi et al. |
| 4,859,944 A | 8/1989 | Webb |
| 2003/0146748 A1* | 8/2003 | Duncan et al. .............. 324/244.1 |
| 2003/0222642 A1* | 12/2003 | Butzmann ................. 324/207.21 |
| 2010/0194387 A1* | 8/2010 | Butzmann et al. ............. 324/252 |
| 2010/0321014 A1* | 12/2010 | Butzmann ....................... 324/252 |
| 2011/0101975 A1* | 5/2011 | Popovic et al. ................ 324/251 |
| 2011/0175603 A1* | 7/2011 | Burtman et al. .............. 324/244 |

FOREIGN PATENT DOCUMENTS

| | | |
|---|---|---|
| DE | 33 03 961 A1 | 8/1983 |
| DE | 196 15 017 A1 | 10/1997 |
| JP | 57071504 A | 5/1982 |

OTHER PUBLICATIONS

Moran, T. J., et al; "Magnetoresistive Sensor for Weak Magnetic Fields"; Applied Physics Letters; AIP, American Institute of Physics, Melville, NY, US; vol. 70, No. 14; Apr. 7, 1997; pp. 1894-1896.
Flynn, D., "Demodulation of a Magnetoresistive Sensor Signal to Achieve a Low-Cost, Stable and High-Resolution Vector Magnetometer"; Sensors and Actuators A; Elsevier Sequoia S.A., Lausanne, CH: vol. 50, No. 3; Sep. 1, 1995; pp. 187-190.
International Search Report from PCT/IB2008/053443 dated Jun. 16, 2009.

* cited by examiner

*Primary Examiner* — Jermele M Hollington
(74) *Attorney, Agent, or Firm* — Kramer & Amado P.C.

(57) ABSTRACT

The invention relates to a method and a sensor device (1) for measuring a magnetic field comprising a first circuit (4) including a magneto sensitive sensor element (2) and a current source (5) and a second circuit (6) including a signal generator (7) and a coil (3) producing a excitational magnetic field at the sensor element (2), wherein the output signal of the sensor element is processible such that a second derivative of the sensor signal and the signal of the signal generator are derivable which are processible such that a countable signal is resulting being a measure of the magnetic field.

15 Claims, 2 Drawing Sheets

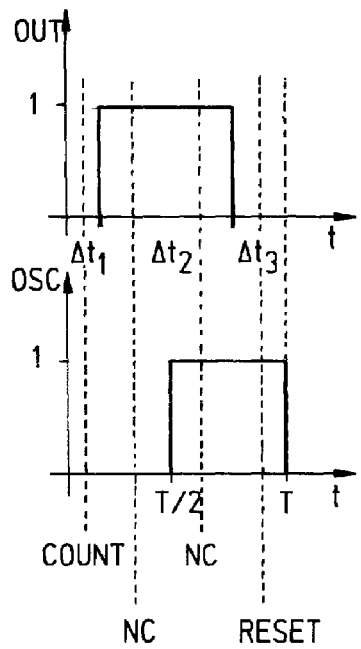
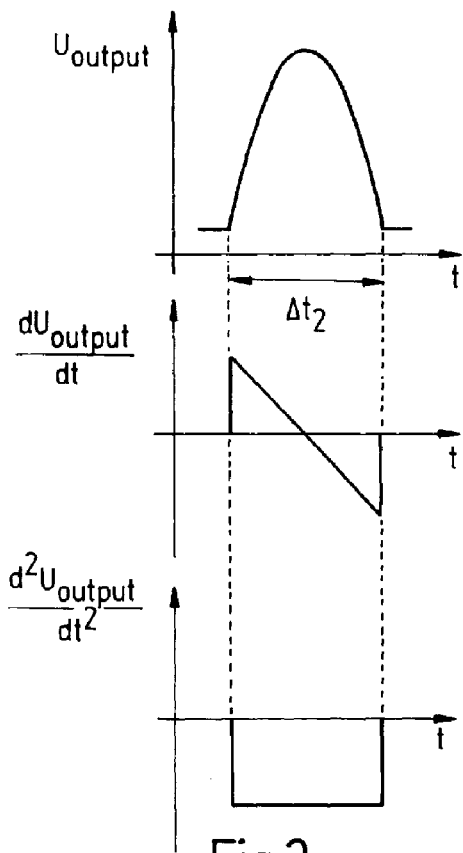
Fig.3
Fig.4
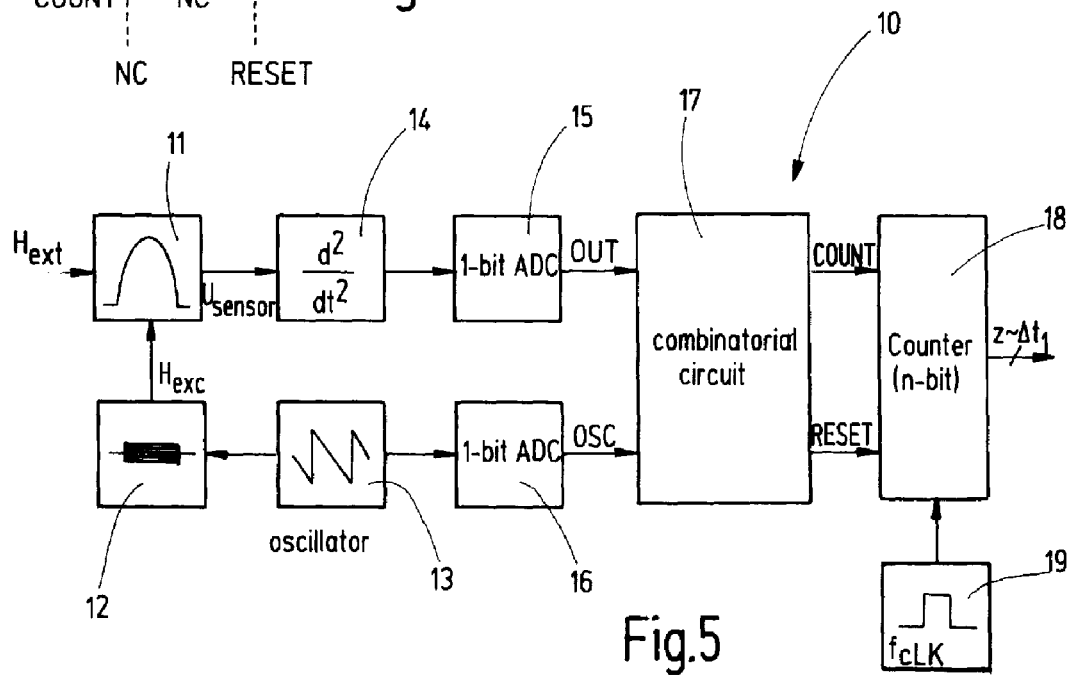
Fig.5

SENSOR DEVICE AND METHOD

FIELD OF THE INVENTION

The invention relates to a sensor device according to the preamble of claim 1 and to a method according to the preamble of claim 7.

BACKGROUND OF THE INVENTION

Rotational speed sensors are often used to measure the rotational speed of automotive elements and therefore are often used within automotive applications. Such applications are know like anti lock breaking systems (ABS-systems), automotive engines or automotive transmissions or automotive control or security systems.

In the prior art AMR (anisotropic magneto resistance) sensors are well known and they are widely-used in the field of automotive applications. Moreover, they are often preferred because of their large sensing distance and relative high sensitivity. However, such known AMR sensors are not able to satisfy increasing requirements concerning the air gap capability. Especially automotive transmission applications need a large sensing distance, which must be realized by the use of expensive rare-earth magnets until now.

The sensing distance of rotational speed sensors depends on many parameters. One of them is the sensitivity of the sensor. Especially in the case of passive gear wheels of transmissions the air gap capability also depends strongly on the energy of the permanent magnet. The sensing distance can be enlarged either by enhancement of sensitivity or by using a stronger magnet. Unfortunately, strong magnets consisting of rare-earth materials are very expensive so that the air gap capability is limited by the sensitivity of the sensor and acceptable product costs.

Moreover, state-of-the-art AMR sensors equipped with standard magnets consisting of iron, ferrite or AlNiCo-alloy are not able to provide air gap capabilities which are required in many fields of applications such as automotive transmission systems.

OBJECT AND SUMMARY OF THE INVENTION

It is an object of the invention to create a sensor device and a respective method which allows a higher sensitivity in order to realize larger sensing distances but which are not that expensive compared to sensor devices containing rare-earth magnets.

Furthermore it is an object of the invention to increase the sensitivity of a sensor device using weak magnetic fields and mitigating or avoiding the use of expensive rare-earth magnets. Furthermore in case of the use of rare-earth magnets it is the object of the invention to increase the sensitivity compared to the sensitivity of the known technology.

The above mentioned objects will be achieved using a sensor device containing the features of claim 1. Additionally the objects regarding the method will be achieved using a method according to claim 7.

The inventive sensor device for measuring a magnetic field comprises a first circuit including a magneto sensitive sensor element e.g. like a AMR-element and a current or a voltage source and a second circuit including a signal generator and a coil producing a excitational magnetic field at the sensor element, furthermore the output signal of the sensor element is processible such that a second derivative of the sensor signal and of the signal of the signal generator are derivable which are further processible such that a countable signal is resulting being a measure of the magnetic field.

According to the invention it is of advantage if the signal generator creates an oscillating signal like e.g. a saw wave signal or an other periodic signal.

Furthermore it is of advantage if the second derivative of the sensor signal and/or of the signal of the signal generator are used as input signals of a respective analog to digital converter (ADC).

According to one embodiment of the invention it is favourable that an output signal of at least one analog to digital converter is used as input signal of a combinatorial device to create a countable signal. According to an embodiment of the invention it is of advantage if the two signals are used as input of the combinatorial device. Additionally it is of advantage that the output signal of the combinatorial device includes a signal information which is countable by a counter. Therefore the counted signal is preferably a measure of the external magnetic field.

Furthermore it is of advantage that the magneto sensitive sensor element is a non-linear anisotropic magneto-resistance (AMR) or a giant magnetoresistive (GMR) device.

The inventive method for treating a sensor device for measuring a magnetic field comprises a first circuit including a magneto sensitive sensor element, e.g. an AMR element, and a current or a voltage source and a second circuit including a signal generator and a coil producing a excitational magnetic field at the sensor element, containing the steps that the output signal of the sensor element is processed such that a second derivative of the sensor signal and of the signal of the signal generator are derived which are further processed such that signal is counted being a measure of the magnetic field.

Furthermore it is of advantage that the second derivative of the sensor signal and/or of the signal of the signal generator are used as input signals of a respective analog to digital converter (ADC). Moreover it is of advantage that the output signal of the at least one analog to digital converter is used as input signal of a combinatorial device to create a countable signal which includes a signal information which is counted by a counter.

BRIEF DESCRIPTION OF THE DRAWINGS

The above and other features and advantages of the invention will be apparent from the following description of an exemplary embodiment of the invention with reference to the accompanying drawings, in which:

FIG. 3 shows a diagram displaying a output signal and the respective first and second derivative;

FIG. 4 shows a diagram displaying signals as a function of time; and

FIG. 5 shows a block diagram to explain the invention.

DESCRIPTION OF EMBODIMENTS

Figure 1:
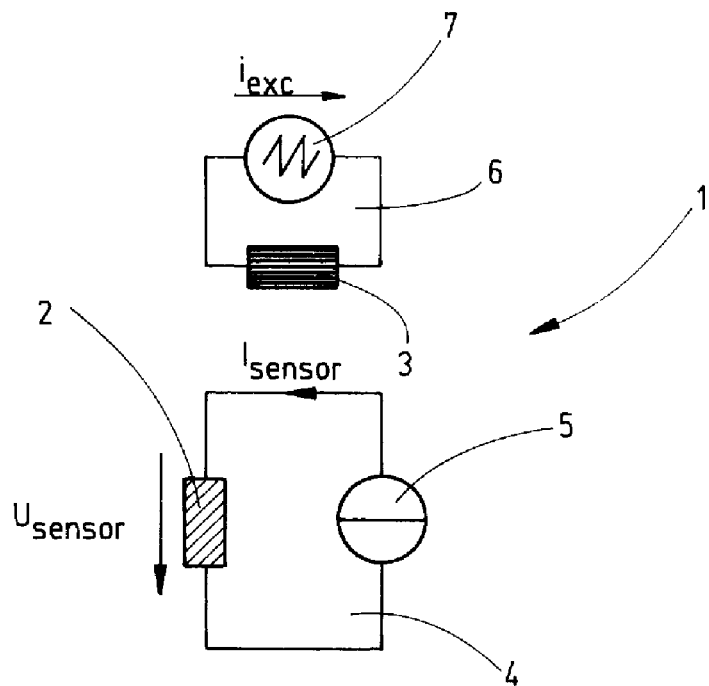
FIG. 1 shows a schematic diagram of an inventive sensor device.

FIG. 1 shows a schematic diagram to explain the inventive sensor device 1. Accordingly the sensor device 1 consists preferably of a non-linearised AMR element 2 and a coil 3. The AMR element 2 is connected or switched in a circuit 4 with a current source 5. The current source 5 creates a current $I_{sensor}$ which is responsible for a voltage drop $U_{sensor}$ along the AMR element 2. The coil 3 is part of a second circuit 6 containing a excitation device 7 creating an excitation current $I_{ext}$. The coil 3 creates a magnetic periodic excitation in y-direction, which must be large enough so that the AMR element 2 reaches saturation. For a demodulation a linear exaction is advantageous, e.g. a saw wave.

Instead of the current source (5) a voltage source (5) may be used too. In this case instead of the voltage signal a current signal has to be evaluated to receive the respective signal information. The following description describes only the evaluation of the voltage signal but as mentioned above an evaluation of a current signal is possible too.

The device will be driven by a method which can be described by the measurement of weak magnetic fields by a demodulation of a phase modulated sensor output signal.

For this purpose a non-linearised sensor element 3 is driven by an AC excitation via the excitation device 7 in y-direction. In order to excite the sensor element 3 it is possible to realise the coil as an on-chip coil 3, which modulates the magnetic field. Since the excitation is large the sensor element 3 approaches saturation and an output signal is generated, where the magnitude of the signal is independent on external magnetic fields. However, an external magnetic field leads to a phase modulation of the sensor signal which can be demodulated with high accuracy.

For a negligible field in x-direction ($H_x \to 0$) the AMR sensor 3 without Barber poles can be calculated by equation (1):

$$R_{sensor} = R_0 - \Delta R \left(1 - \left(\frac{H_y}{H_0}\right)^2\right). \tag{1}$$

In equation (1) $H_0$ represents a constant comprising the so-called demagnetizing and anisotropic field. Under the assumption that the field in x-direction is negligible ($H_x \to 0$) the sensor 3 is saturated $|H_y| \geq H_0$.

As aforementioned a periodical, linear excitation is an advantageous choice, for example a saw wave $$H_{exc}(t) = \hat{H}_{exc}\left(\frac{2}{T}t - 1\right) \tag{2}$$

where $\hat{H}_{ext}(x)$ denotes a function of an argument (x), T denotes a time constant and t denotes the time, with $$\hat{H}_{exc} > H_0. \tag{3}$$

Instead of a saw wave any periodical wave form as exaction is possible. Even nonlinear or transcendental excitations are possible.

In order to create a magnetic field given in equation (2) a periodic current $$i_{exc}(t) = I_{exc}\left(\frac{2}{T}t - 1\right) \tag{4}$$

is used. In equation (4) $I_{ext}(x)$ denotes a function of an argument x, T denotes a time constant and t denotes the time.

Under these assumptions the sensor 3 is saturated if $|H_y| \geq H_0$.

In the following the magnetic field which has to be measured is called the external field $H_{ext}$. It remains constant for an adequate choice of T. A superposition of the excitation and the external field leads to the magnetic input signal of the sensor:

$$H_y(t) = H_{ext} + \hat{H}_{exc}\left(\frac{2}{T}t - 1\right) \tag{5}$$

If we put equation (5) into equation (1) we arrive at $$R_{sensor}(t) = R_0 - \Delta R \left(\frac{H_{ext} + \hat{H}_{exc}\left(\frac{2}{T}t - 1\right)}{H_0}\right)^2. \tag{6}$$

For a constant current $I_{sensor}$ ($I_{sensor}$=const.) the output signal of the sensor 3 is given by $$u_{sensor}(t) = R_0 I_{sensor} - \Delta R I_{sensor}\left(\frac{H_{ext} + \hat{H}_{exc}\left(\frac{2}{T}t - 1\right)}{H_0}\right)^2. \tag{7}$$

Figure 2:
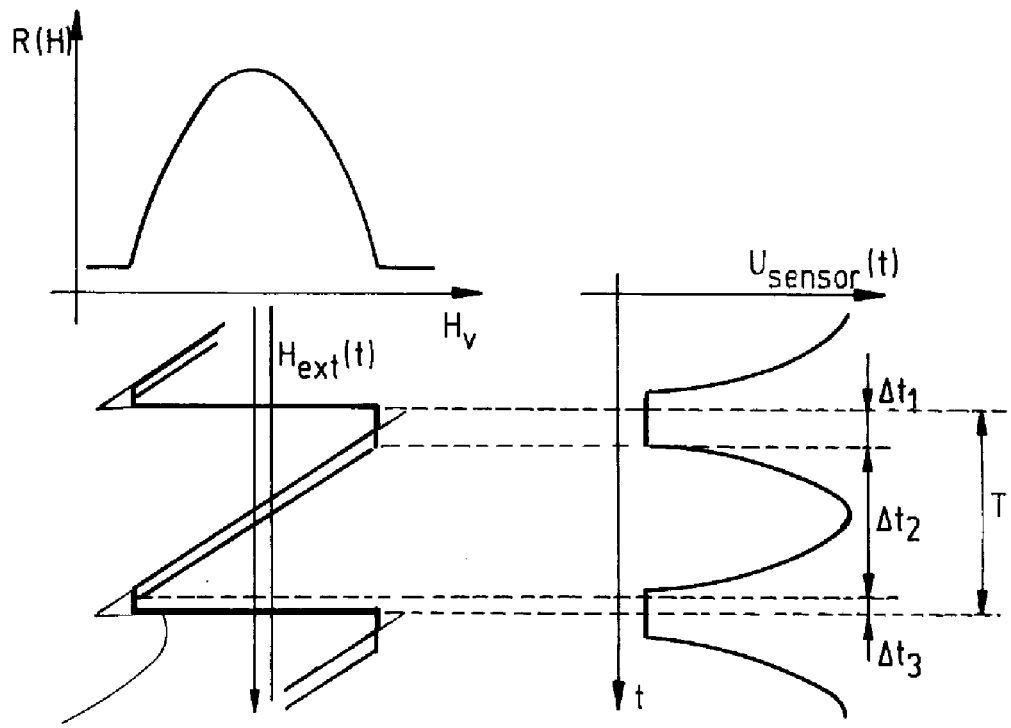
FIG. 2 shows a diagram displaying the functionality of the inventive device.

FIG. 2 shows in a diagram the relationship between the excitation $H_{exc}$, transfer characteristic R(H), external magnetic field $H_{ext}$ and the output signal $U_{sensor}$.

As shown in FIG. 2 the time intervals $\Delta t_1$ and $\Delta t_3$ depend on $H_{ext}$, while $\Delta t_2$ is constant:

$$\Delta t_1 = \frac{T}{2}\left(1 - \frac{H_0 + H_{ext}}{\hat{H}_{exc}}\right) \tag{8}$$

$$\Delta t_2 = T\frac{H_0}{\hat{H}_{exc}} \tag{9}$$

$$\Delta t_3 = \frac{T}{2}\left(1 - \frac{H_0 - H_{ext}}{\hat{H}_{exc}}\right) \tag{10}$$

The equations (8) to (10) describe a phase modulation of the output signal $U_{sensor}$ in dependency on the magnetic field $H_{ext}$. According to the above equations the pulse defined by the constant time span $\Delta t_2$ changes its position in T given by $\Delta t_1$ and $\Delta t_3$.

To get or extract $H_{ext}$ several methods are applicable:

First, a PM-demodulation can be performed. For this purpose many techniques are available, e.g. a discriminator followed by an AM demodulator or a PLL-demodulator.

Second, if only a half period of the output signal is taken into account $H_{ext}$ is given by the duty cycle of the output signal $U_{sensor}$. However, the simplest way to get the external field is the measurement of $\Delta t_1$ or $\Delta t_3$ by a counter, e.g. a digital counter. In this case an analog-to-digital conversion is performed, where the accuracy depends on the clock frequency of the counter. For time measurement it is suitable to modify the output signal given in equation (7).

Thus one finds $$\frac{du_{sensor}}{dt} = -\frac{4\Delta R I_{sensor}}{T}\frac{\hat{H}_{exc}}{H_0}\frac{H_{ext} + \hat{H}_{exc}\left(\frac{2}{T}t - 1\right)}{H_0} \tag{11}$$

and $$\frac{d^2 u_{sensor}}{dt^2} = -\frac{8\Delta R I_{sensor}}{T^2}\left(\frac{\hat{H}_{exc}}{H_0}\right)^2 \tag{12}$$

The qualitative behaviour of equations (7), (11) and (12) is shown in FIG. 3, where $U_{sensor}$ is shown as $U_{output}$. The upper graph shows the output signal as a function of time. The graph in the middle shows the first derivative of the output signal and the lower graph shows the respective second derivative of the output signal.

By means of a 1-bit A/D conversion equation (12) as well as equation (4) can be converted to the digital signals OUT and OSC. As shown in FIG. 4 for $\Delta t_1 < T/2$ both signals, OUT and OSC, can be used to create control signals for a digital counter.

The simplified block diagram 10 of the signal processing unit is shown in FIG. 5. FIG. 5 shows a block 11 wherein a sensor 2 creates a sensor signal $U_{sensor}$. This sensor signal is triggered by the external magnetic field $H_{ext}$ and the excitation field $H_{exc}$ crated by the coil 12 and the oscillating excitation 13 of the oscillator 7. The sensor signal will be processed in block 14, where a second derivative $d^2 U_{sensor}/dt^2$ of the sensor signal will be produced. In the two blocks 15 and 16 a 1-bit analog to digital converter (ADC) converts the signals of blocks 13 or 14 respectively to a signal OUT and OSC. Block 17 is a combinatorial block to create a signal which can be counted by a counter 18 triggered by the function generator 19.

As described above a AMR device can be used. According to an other inventive embodiment a giant magnetoresistive device (GMR) may be used as sensing device too. Therefore it is of advantage to use a GMR-device consisting of a multi-layer structure.

| References | |
|---|---|
| 1 | sensor device |
| 2 | sensor element |
| 3 | coil |
| 4 | circuit |
| 5 | current or voltage source |
| 6 | circuit |
| 7 | excitation device |
| 10 | block diagram |
| 11 | block |
| 12 | coil |
| 13 | excitation |
| 14 | block |
| 15 | analog to digital converter |
| 16 | analog to digital converter |
| 17 | combinatorial block |
| 18 | counter |
| 19 | function generator |

The invention claimed is:

1. A sensor device for measuring a magnetic field comprising:
   a first circuit further comprising:
      a magneto sensitive sensor element, and
      a current or voltage source;
   a second circuit further coinprising:
      a signal generator, and
      a coil configured to produce an excitational magnetic field at the magneto sensitive sensor element; and
   a signal processing unit configured to process an output signal of the magneto sensitive sensor element to derive a second derivative of the output signal, and process the second derivative to create a control signal for a digital counter.

2. The sensor device according to claim 1, wherein the signal generator is configured to create an oscillating signal.

3. The sensor device according to claim 1, wherein the second derivative and a signal of the signal generator are used as input signals of an analog to digital converter.

4. The sensor device according to claim 3, wherein an output signal of the analog to digital converter is used as an input signal of a combinatorial device to create a countable signal.

5. The sensor device according to claim 4, wherein an output signal of the combinatorial device includes information which is countable by a counter.

6. The sensor device according to claim 1, wherein the magneto sensitive sensor element is either a non-linear anisotropic magneto-resistance (AMR) or a giant magnetoresistive (GMR) device.

7. The sensor device according to claim 1, wherein the coil is configured to produce a magnetic periodic excitation in a y-direction.

8. The sensor device according to claim 1, wherein the coil is configured to saturate an AMR element.

9. A method for treating a sensor device for measuring a magnetic field, the method comprising:
   producing, with a coil, an excitational magnetic field at a sensor element;
   processing an output signal of the sensor element to derive a second derivative of the output signal;
   processing the second derivative to create a control signal for a digital counter.

10. The method according to claim 9, further comprising: creating, with the signal generator, an oscillating signal.

11. The method according to claim 9, further comprising: using both the second derivative of the sensor signal and the signal of the signal generator are inputs to an analog to digital converter.

12. The method according to claim 11, further comprising: using an output signal of the analog to digital converter as an input signal of a combinatorial device to create a countable signal.

13. The method according to claim 12, wherein the output signal of the combinatorial device includes information which is counted by a counter.

14. The method of claim 9, further comprising: producing, with the coil, a magnetic periodic excitation in a y-direction.

15. The method of claim 9, further comprising: saturating, with the coil, an AMR element.

* * * * *